US005547019A

United States Patent [19]

Iacullo

[11] Patent Number: 5,547,019
[45] Date of Patent: Aug. 20, 1996

[54] THERMOELECTRIC INTERCOOLER COOLING TURBOCHARGED AIR

[76] Inventor: Robert S. Iacullo, 16906-13th N.W., Seattle, Wash. 98177

[21] Appl. No.: 331,019

[22] Filed: Oct. 28, 1994

[51] Int. Cl.$^6$ ...................................................... F02B 29/4
[52] U.S. Cl. .............................. 165/51; 60/599; 123/563; 417/243; 62/3.3; 62/3.61
[58] Field of Search .............................. 62/3.3, 3.61, 3.4; 417/243; 123/196 AB, 563; 60/599; 165/51, 185

[56] References Cited

U.S. PATENT DOCUMENTS

| | | | |
|---|---|---|---|
| 1,059,685 | 4/1913 | Oberste | 165/163 |
| 2,928,253 | 3/1960 | Lopp et al. | 62/3.3 |
| 3,008,300 | 11/1961 | Ryan et al. | 62/3.3 |
| 3,077,079 | 12/1963 | Pietsch | 62/3.3 |
| 3,077,080 | 12/1963 | Pietsch | 62/3.3 |
| 3,138,934 | 6/1964 | Roane | 62/3.3 |
| 3,148,511 | 9/1964 | Gable | 165/185 |
| 3,212,274 | 10/1965 | Eidus | 62/333 |
| 3,236,056 | 2/1966 | Phillips et al. | 62/3.61 |
| 3,874,183 | 4/1975 | Tabet | 123/196. AB |

FOREIGN PATENT DOCUMENTS

| | | | |
|---|---|---|---|
| 2540978 | 8/1984 | France | 62/3.61 |
| 0126319 | 6/1986 | Japan | 60/599 |
| 0266015 | 10/1989 | Japan | 62/3.61 |
| 4-218424 | 8/1992 | Japan | 165/43 |

Primary Examiner—John K. Ford
Attorney, Agent, or Firm—Christensen O'Connor Johnson & Kindness PLLC

[57] ABSTRACT

An active intercooler for heating or cooling a fluid passing through the intercooler. The intercooler may be used to cool gases from the compression stage of an engine turbocharger in order to increase engine horsepower. The intercooler could also be used to cool the oil in an engine or transmission. Alternately, the intercooler could be used to heat or cool the air provided to the passenger compartment of a vehicle. The active intercooler includes a chamber through which the fluid flows. A thermoelectric heat pump is attached to the chamber in order to remove and dissipate heat from the fluid flowing through the chamber. A control system is provided to control the current supplied to the thermoelectric heat pump and thus the cooling capacity of the thermoelectric heat pump. A heat sink including a plurality of fins is attached to the thermoelectric heat pump on a surface opposite the chamber in order to increase the ability of the thermoelectric heat pump to dissipate heat.

7 Claims, 2 Drawing Sheets

THERMOELECTRIC INTERCOOLER COOLING TURBOCHARGED AIR

FIELD OF THE INVENTION

The present invention relates to intercoolers used to cool fluids, such as the air coming out of the compression stage of an engine turbocharger, the oil in a high performance engine, the oil in a high performance transmission, or the air used to cool a vehicle's interior; specifically, the present invention relates to apparatus for improving the ability of intercoolers to alter the temperature of the fluid as it flows through the intercooler.

BACKGROUND OF THE INVENTION

Intercoolers of one form or another have long been used in a variety of applications throughout industry. An intercooler is a heat transfer device that transfers heat from a gas or liquid (fluids) passing through the device to ambient air. Most intercoolers include fins to improve their heat transfer ability. Often a mechanism, such as a fan, is used to increase airflow past the fins, thus increasing the cooling ability of the intercooler.

One use for intercoolers is to cool the gases exiting the compression stage of a turbocharger before they enter a high performance automotive engine. Cooling the gases increases the density of the gases, which increases the efficiency and the horsepower of the engine. The cooled, higher density gases increase the amount of air forced into the engine by the turbocharger, which increases engine horsepower.

Turbocharger intercoolers are generally mounted at the front of the automobile or near an exterior surface of the automobile such as in a wheel fender or at the rear of the automobile to ensure that high volumes of cool ambient air flow through the fins of the intercooler. Air flowing through the fins of the intercooler cools the exterior of the intercooler by thermal conduction which in turn cools the gases flowing through passageways in the interior of the intercooler. Alternatively, intercoolers may be located within the automobile's body and provided with external air flow through the use of air ducting. Air ducting has the disadvantage of taking up space and adding complication and cost to the automobile.

Turbocharger intercoolers of the type described above, because they are passive, are only capable of cooling the fluids flowing through them by some fixed amount that is dependent on their size, location, temperature of the ambient air, etc. In contrast, a turbocharger intercooler provided with some sort of active cooling system could potentially cool the temperature of the gases below the temperature achievable by a similarly sized passive intercooler.

The present invention is directed to providing a turbocharger intercooler that includes an active cooling system. The provision of an active cooling system increases cooling ability and has the further advantage of allowing the turbocharger to be located away from the exterior surface of the automobile and possibly avoiding the need for air ducting, thus increasing the design options available to an automotive engineer.

In addition to cooling the gases exiting the turbocharger, intercoolers are sometimes used to cool the oil in the engine or transmission of a high performance car. High performance cars tend to heat the oil in the engine and transmission beyond an acceptable level during rigorous operation. Excessive heating of the oil can cause the oil to break down possibly causing catastrophic damage to either the engine or transmission. Even if oil breakdown is not a problem, cooling the engine or transmission oil removes excess heat from and maintains the temperature of the engine or transmission at acceptable levels.

As with intercoolers for turbochargers, oil intercoolers are commonly mounted near an exterior surface of the car in order to allow cool ambient air to flow through the fins of the intercooler. Alternatively, the intercooler may be provided with ambient airflow through the use of air ducting.

As with intercoolers used to cool the gases exiting a turbocharger, oil intercoolers are only capable of cooling the oil passing through them to some predetermined temperature determined by the design and size of the intercooler and the temperature of the ambient air flowing through the intercooler, etc. As with turbocharger intercoolers, oil intercoolers provided with an active cooling system could potentially cool the temperature of the oil flowing through the intercooler to below that of a comparably sized passive oil intercooler. The present invention is also directed to provide such an intercooler.

Potentially, if an intercooler could be provided with an active heating or cooling system, it could also be used to replace the heating and cooling systems in current vehicles, such as automobiles and trucks. The present invention is also directed to provide such an intercooler.

SUMMARY OF THE INVENTION

The present invention increases the cooling capacity of a passive intercooler by coupling a thermoelectric heat pump to the exterior of a passive intercooler to create an active intercooler. Thermoelectric heat pumps utilize the Peltier phenomenon to heat or cool a surface to which they are attached. Thermoelectric heat pumps have a number of advantages. They are fairly inexpensive to purchase and operate, and because-they have no moving parts, they provide long-term durability.

In the present invention, one or more thermoelectric heat pumps are attached to the sides of a passive intercooler. A heat sink may be attached to the side of the thermoelectric heat pumps opposite the intercooler to help dissipate heat removed from the intercooler by the thermoelectric heat pumps. A control system is connected to the thermoelectric heat pumps to control the temperature of the intercooler by controlling the current supplied to the heat pumps. Controlling the current supplied to the thermoelectric heat pumps controls the amount of heat-energy removed from the intercooler and thus from the fluid passing through the intercooler.

Active intercoolers formed in accordance with the present invention can be used to cool the gases exiting a turbocharger prior to providing the gases to the engine. Alternatively, active intercoolers formed in accordance with the present invention can be used to cool the engine or transmission. If desired, active intercoolers formed in accordance with the present invention can be used to heat as well as cool the fluids of the engine, transmission or turbochargers. Further, active intercoolers formed in accordance with the invention are potentially useful in other than engine environments.

Active intercoolers formed in accordance with the present invention can also be used to heat or cool the air provided to the interior of a vehicle. Thus, the present invention may be used to supplement or replace current vehicular heating and cooling systems. The interior air can be passed through an intercooler formed in accordance with the present invention, thereby being heated or cooled. The resulting heated or cooled air may then be directed into the interior of the vehicle.

As discussed above, in order to increase efficiency in some embodiments, a heat sink may be attached to the surface of the thermoelectric heat pumps opposite the intercooler. Preferably, the heat sink includes fins for distributing heat to the surrounding air. In one embodiment, the cooling fins and passages of a passive intercooler are enclosed in a sealed chamber. The interior spaces of the sealed chamber are then filled with an antifreeze to increase thermal conduction between thermoelectric heat pumps mounted on the exterior of the sealed chamber and the cooling fins and passages in the interior of the intercooler.

As will be understood from the foregoing description, the present invention is directed to providing active intercoolers that have an increased cooling capacity when compared to similarly sized passive intercoolers, creating a number of advantages over passive intercoolers. Increasing the cooling ability of a gas intercooler attached to a turbocharger increases engine horsepower. Increasing the cooling capacity of an engine, or transmission, oil intercooler helps the intercooler to maintain the temperature of the oil and thus engine and transmission at an acceptable level, thus decreasing the chance of oil breakdown or engine or transmission failure. In addition to increasing the cooling capacity of the intercooler, the present invention decreases or eliminates the intercooler's dependency upon a supply of cool external airflow. This reduced dependency on external airflow allows the intercooler of the present invention to be located at locations within the automobile previously not available. Thus, the present invention can increase the design options available to the automotive engineer.

BRIEF DESCRIPTION OF THE DRAWINGS

The foregoing aspects and many of the attendant advantages of the invention will become better appreciated as the invention is better understood by reference to the following detailed description in conjunction with the accompanying drawings, wherein.

DETAILED DESCRIPTION OF THE PREFERRED EMBODIMENT

Figure 1:
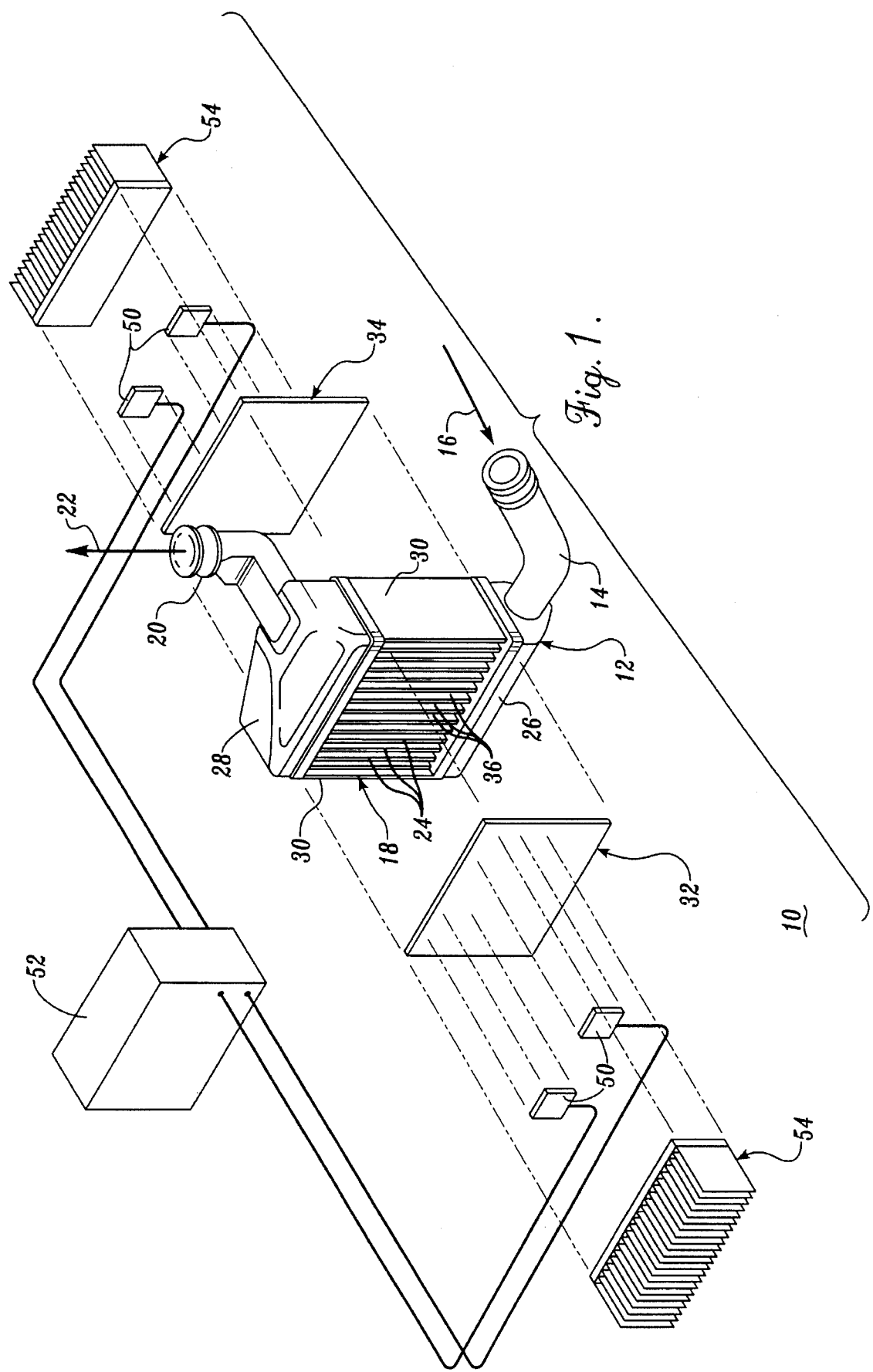
FIG. 1 is a perspective view of an intercooler according to the present invention.

FIG. 1 illustrates a perspective view of a preferred embodiment of an intercooler according to the present invention. The intercooler 10 includes a chamber 12 through which a fluid flows. The chamber 12 could be any standard passive intercooler. The fluid enters the chamber 12 through an inlet pipe 14 at the chamber's bottom right corner as shown by arrow 16. The fluid then flows through the body 18 of the chamber 12 and exits the chamber through an outlet pipe 20 located at the upper right corner as shown by arrow 22. Preferably, the body 18 of the intercooler includes a series of passages or tubes 24 that extend vertically between the bottom 26 and top 28 of the intercooler chamber as shown in FIG. 1. The fluid passes through the bottom 26 of the chamber, then through the tubes 24, and finally through the top 28 of the chamber.

Passing the fluid through a series of smaller passages or tubes 24 increases the contact surface area between the fluid flowing through the intercooler and the intercooler chamber. This increase in contact surface area increases the efficiency of the intercooler by increasing the surface area available for heat transfer between the fluid and the intercooler chamber.

The passages or tubes 24 could be a series of vertical tubes as shown in FIG. 1 or they could be passages of an infinite number of configurations as commonly used in prior intercoolers or radiators. However, tubes 24 should be configured to maximize the surface area available for heat conduction between the intercooler chamber and the fluid passing through the chamber. The shape and layout of the chamber 12 and inlet 14 and outlet pipes 20 could change depending upon the application and space requirements. To ensure good heat conduction, the chamber 12 and passages or tubes 24 may advantageously be formed of a material that is highly thermally conductive. Some materials having good thermal conduction that may be used include aluminum, aluminum alloys or tin. In some embodiments, it may be advantageous to place cooling fins (not shown) between the passages or tubes 24 to increase heat conduction between the intercooler chamber 12 and ambient air surrounding the chamber.

In the embodiment of the invention shown in FIG. 1, the passages or tubes 24 are enclosed within a sealed chamber formed by two side plates 30, a front plate 32 and a back plate 34 that are attached along their edges to the chamber 12. In order to increase the thermal conduction between the fluid passages 24 and the front 32, back 34 and side plates 30, preferably the interior 36 of the sealed chamber is filled with a high thermally conductive fluid such as an antifreeze.

Two thermoelectric heat pumps 50 are mounted on both the front and back plates 32 and 34 of the chamber 12 to create an active intercooler. The thermoelectric heat pumps 50 function in accordance with the Peltier phenomenon and are commercially available from a number of sources including Melcor located at 990 Spruce Street, Trenton, N.J. 08648. Thermoelectric heat pumps are available in a variety of sizes, shapes, operating currents, operating voltages and ranges of heating or cooling capacity.

In general, thermoelectric heat pumps include two elements formed from a semiconductor such as bismuth telluride, heavily doped to create a semiconductor having either an excess "N-type" or deficiency "P-type" of electrons. When electric current is applied to a thermoelectric heat pump, electrons flow from one of the semiconductor elements forming the thermoelectric heat pump to the other element, which causes heat to be pumped from one element to the other. The heat absorbed at the "cold junction" is passed or "pumped" to the hot junction at a rate proportional to the current passing through the thermoelectric heat pump. Regulating the current passing though the thermoelectric heat pump regulates the amount of heat pumped from one semiconductor element of the heat pump to the other. Thermoelectric heat pumps are capable of operating in either direction, i.e., of passing heat from either of the semiconductor elements to the other by reversing the direction of current flow.

Each thermoelectric heat pump 50 is attached to a control system 52 that controls the direction and magnitude of the current flowing through the heat pumps. Controlling the magnitude and direction of the current allows the control system to adjust the amount of heat removed from the front and back plates 32 and 34 of the intercooler chamber. The temperature of the front 32 and back 34 plates of the intercooler chamber in turn determines the amount of heat lost by the fluid flowing through the intercooler chamber, thus the temperature of the fluid exiting the outlet pipe 20.

In some applications, it may be advantageous for a temperature sensor (not shown) to be located in the outlet pipe 20 and connected to the control system 52 to provide a feedback signal for regulating the temperature of the fluid exiting the intercooler.

In order to increase the efficiency of the thermoelectric heat pumps, FIG. 1 also illustrates that it is advantageous to attach a conductive heat sink 54 to the side of the heat pumps 50 opposite the side attached to the front or back plates 32 or 34 of the intercooler chamber. Preferably, each heat sink includes a number of fins to increase heat dissipation between the heat sink and the surrounding air. Heat removed from the front and back plates 32 and 34 of the intercooler chamber passes through the thermoelectric heat pumps and into the heat sinks 54 where the heat is dissipated in the surrounding ambient air.

Preferably, each heat sink 54 is sized and formed of a material that has sufficient heat conduction to dissipate the quantity of heat removed from the intercooler by the thermoelectric heat pumps. Similarly, the size, shape, and cooling capacity of the thermoelectric heat pumps is determined by the specific application and the amount of cooling capacity required.

The physical arrangements of the elements of the intercooler may differ substantially from that shown in FIG. 1 without departing from the spirit and scope of the present invention. As an example, the shape and size of the intercooler, heat sinks or thermoelectric heat pumps could differ. In addition, the location of the thermoelectric heat pumps or of the inlet or outlet pipes on the intercooler could differ.

Active intercoolers formed in accordance with the present invention may be advantageously used to cool the gases exiting the compression stage of a turbocharger prior to providing them to the engine. Cooling the gases provided to the engine increases the density of the gases, thus increasing the engine's horsepower.

Intercoolers formed in accordance with the present invention can also be used as engine or transmission intercoolers. In these applications, the intercooler could help maintain the oil within an appropriate operating range, thus preventing the oil from breaking down. In addition, cooling an engine's or transmission's oil helps to maintain the transmission and engine temperature at an acceptable level.

Active intercoolers formed in accordance with this invention provide more cooling capacity than similar sized passive intercoolers and decrease or eliminate the intercooler's dependence on a continuous flow of ambient air to maintain the intercooler's cooling ability. Thus, the present invention increases the design options available to the automotive designer.

Active intercoolers formed in accordance with the invention may be used to heat or cool the gases passing through them. Thus, an active intercooler according to the invention may be used to supplement or replace heating and cooling systems in a vehicle such as an automobile. The gases entering the interior of the vehicle can first be passed through an active intercooler to heat or cool the gases to the desired temperature.

Active intercoolers according to the present invention are relatively easy and inexpensive to fabricate, require no movable parts, and use no environmentally damaging refrigerants such as freon. The present invention's ability to provide a cooling capacity without the use of refrigerants may become more important in the future as the use of freon and other damaging refrigerants are eliminated.

A second embodiment of the present invention will now be described with reference to FIG. 2. Features of the second embodiment not described below function in a manner similar to the preferred embodiment and may be understood by reference to the discussion of the preferred embodiment above. In the second embodiment, the intercooler 110 includes an intercooler chamber 112 having an inlet pipe 114 that allows fluid to flow into the chamber as shown by arrow 116. The inlet pipe is located at the lower right-hand corner of the chamber and extends into the bottom 126 of the chamber. Fluid flows into the chamber through the inlet pipe 114 and then flows through the body 118 of the chamber through a series of passages or tubes 124 in a manner similar to that described with respect to the preferred embodiment. The fluid then exits the top left corner of the chamber through an outlet pipe 120 as shown by arrow 122.

Figure 2:
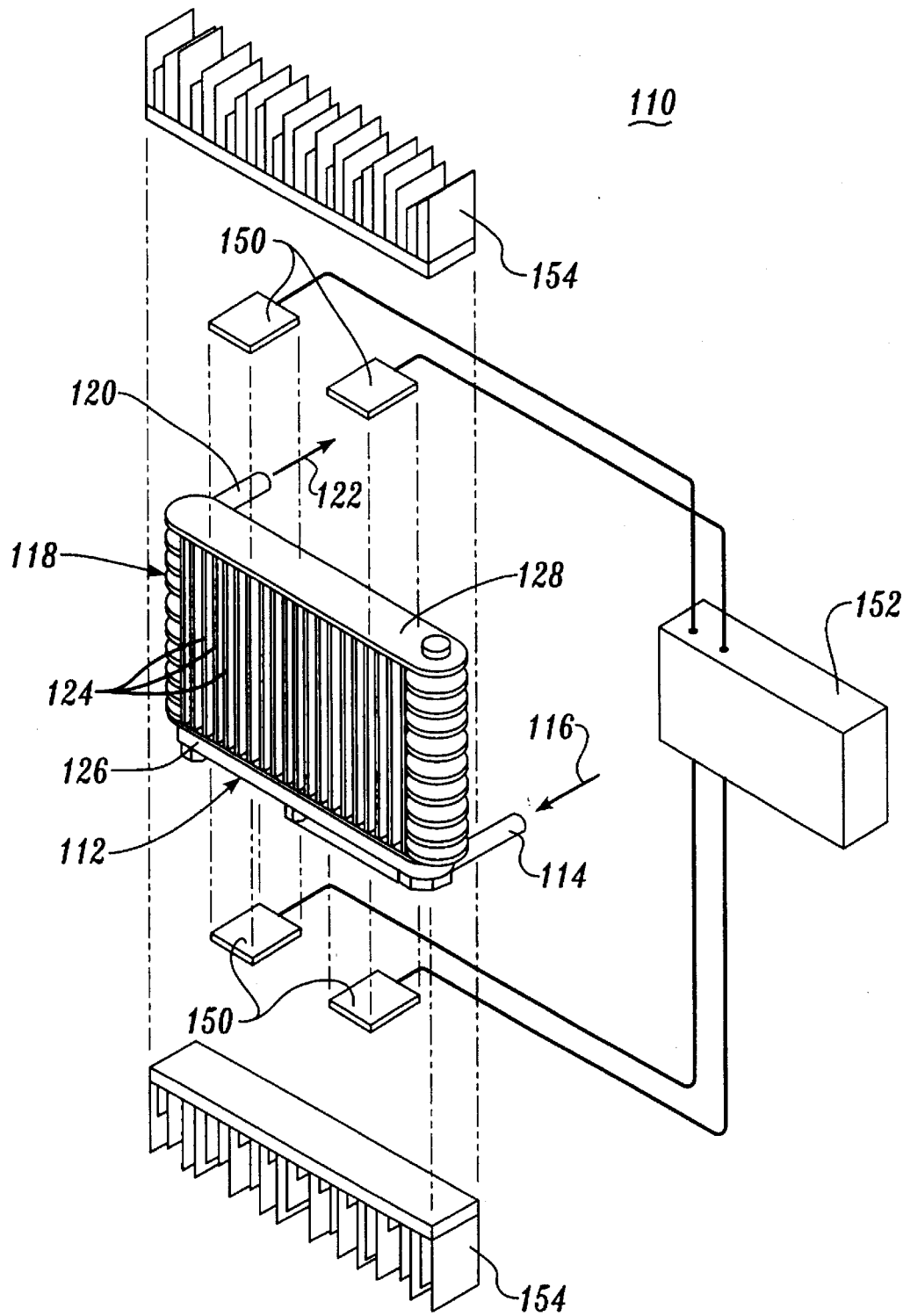
FIG. 2 is a perspective view of an alternate embodiment of an intercooler according to the present invention.

In the embodiment of the invention shown in FIG. 2, the passages or tubes 124 are left exposed to the ambient air to allow air to flow freely in between the individual tubes 124. As a result, it is advantageous to mount such embodiments of the invention near an external surface of an automobile so that cool ambient air may flow through the intercooler to help cool the fluid flowing through the intercooler. Alternately, the intercooler could be located within the body of the automobile and air ducting used to direct air past the tubes 124.

Two thermoelectric heat pumps 150 are coupled to the bottom 126 and top 128 of the chamber 112. The thermoelectric heat pumps 150 should be mounted on the chamber to provide good heat conduction between the thermoelectric heat pumps and the structure of the intercooler. To help provide efficient heat conduction between the top 128 and bottom 126 of the chamber 112 and the thermoelectric heat pumps it is advantageous to form the chamber from a highly conductive material such as an aluminum alloy or tin. Each thermoelectric heat pump 150 is connected to a control system 152 that controls the cooling or heating capacity of the thermoelectric heat pumps in a manner similar to that described with respect to the embodiment of the invention shown in FIG. 1.

In order to increase efficiency, heat sinks 154 are connected to the surfaces of the thermoelectric heat pumps opposite the intercooler chamber. As with the embodiment of the invention shown in FIG. 1, the heat sinks help to remove and dissipate the heat removed from the intercooler chamber by the thermoelectric heat pumps. Preferably the heat sinks include fins and are formed from a high thermally conductive material such as aluminum to assist in heat dissipation.

As with the embodiment of the invention shown in FIG. 1, the alternate embodiment of the invention shown in FIG. 2 could be used as a turbocharger intercooler, a transmission or engine oil intercooler, or to heat or cool the gases provided to the interior of the automobile. The alternate embodiment is intended to make use of the heat transfer created by ambient air flowing around the tubes 124 and created by the thermoelectric heat pumps, both of which cool the fluid flowing through the intercooler.

While preferred embodiments of the invention have been illustrated and described, it will be appreciated that within the scope of the appended claims various changes can be made therein without departing from the spirit of the invention.

The embodiments of the invention in which an exclusive property or privilege is claimed are defined as follows:

1. An active intercooler for heating or cooling the gazes exiting a compression stage of a turbocharger, the intercooler comprising:

a chamber for receiving the gases exiting the compression stage of the turbocharger, the interior of the chamber having a plurality of tubes through which the gases flow, and an antifreeze filling the chamber and surrounding the tubes;

a thermoelectric heat pump thermally coupled to the chamber; and temperature control means for controlling the current flow through the thermoelectric heat pump to control the temperature of the chamber and, thus, the temperature of the gases flowing through the chamber.

2. The intercooler of claim 1, further including a heat sink having a plurality of fins attached to a side of the thermoelectric heat pump opposite the chamber.

3. An intercooler used to cool the gases exiting a compression stage of a turbocharger before the gases are provided to an engine, the intercooler comprising:

a chamber connected to said compression stage of said turbocharger so that the gases from said compression stage of said turbocharger flow through the chamber, the chamber including a plurality of tubes through which the gases flow and the interior of the chamber surrounding said tubes being filled with an antifreeze;

a thermoelectric heat pump attached to the side of the chamber; and means for controlling the current flow through the thermoelectric heat pump to control the rate of heat removed from the gases and dissipated by the intercooler.

4. The intercooler of claim 3, further comprising a heat sink including a plurality of fins attached to the thermoelectric heat pump.

5. An intercooler for cooling a fluid passing through the intercooler, the intercooler comprising:

a chamber having an interior and an exterior, the interior of the chamber including a plurality of tubes that are in fluid connection with a compression stage of a turbocharger, the gases from the compression stage of the turbocharger flowing through the tubes prior to being provided to an engine, wherein the interior of the chamber surrounding the tubes is filled with an antifreeze;

a thermoelectric heat pump attached to at least one side of the chamber; and control means for controlling the current supplied to the thermoelectric heat pump to control the temperature of the gases flowing through the chamber by controlling the rate of heat transfer between the chamber and the thermoelectric heat pump.

6. The intercooler of claim 5, further comprising a heat sink including a plurality of fins attached to a side of the thermoelectric heat pump opposite the chamber.

7. The intercooler of claim 5, further including an inlet attached to the chamber in order to allow the gases to flow into one end of the tubes and an outlet attached to the other end of the tubes so as to allow the gases to flow out of the chamber.

\* \* \* \* \*